United States Patent
Price, Jr.

(10) Patent No.: US 7,236,030 B2
(45) Date of Patent: Jun. 26, 2007

(54) METHOD TO IMPLEMENT HYSTERESIS IN A MOSFET DIFFERENTIAL PAIR INPUT STAGE

(75) Inventor: John J. Price, Jr., Eagan, MN (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/881,611

(22) Filed: Jun. 30, 2004

(65) Prior Publication Data

US 2006/0001453 A1    Jan. 5, 2006

(51) Int. Cl.
*H03K 3/00* (2006.01)
(52) U.S. Cl. ...................... 327/205; 327/206
(58) Field of Classification Search ............ 327/205, 327/206
See application file for complete search history.

(56) References Cited

U.S. PATENT DOCUMENTS

| | | | | |
|---|---|---|---|---|
| 6,064,262 A | * | 5/2000 | Wang | 330/253 |
| 6,140,877 A | * | 10/2000 | Forbes | 330/258 |
| 6,362,687 B2 | * | 3/2002 | Cox | 330/253 |
| 6,580,326 B2 | * | 6/2003 | Bach et al. | 330/277 |
| 6,614,301 B2 | * | 9/2003 | Casper et al. | 330/253 |
| 6,873,209 B2 | * | 3/2005 | Takata et al. | 330/253 |
| 6,911,858 B2 | * | 6/2005 | Mori | 327/307 |

* cited by examiner

*Primary Examiner*—Kenneth B. Wells
(74) *Attorney, Agent, or Firm*—Wade J. Brady, III; Frederick J. Telecky, Jr.

(57) ABSTRACT

A simplified comparator circuit (10) having hysteresis and lower power requirements for its implementation. The circuit (10) includes 2 minimum-sized MOSFETs (MN4, MN5) providing feedback from the circuit output to an input device (MN1) body to produce hystereis, requiring very little power. This invention is suitable for applications not requiring a precisely set hysteresis magnitude.

3 Claims, 1 Drawing Sheet

METHOD TO IMPLEMENT HYSTERESIS IN A MOSFET DIFFERENTIAL PAIR INPUT STAGE

FIELD OF THE INVENTION

The present invention is generally directed to MOSFET differential pair circuits, and more particularly to such circuits having hysteresis.

BACKGROUND OF THE INVENTION

Comparator circuits often are implemented with hysteresis from output to input to prevent noise on the input from causing multiple switches in output, or chatter. There have been many means devised to accomplish the hysteresis, such as using a resistor network from input to output dissipating power in at least one state. Examples of some are shown in U.S. Pat. No. 4,110,641 to Robert L. Payne entitled "CMOS Voltage Comparator with Internal Hysteresis" and U.S. Pat. No. 4,394,587 to McKenzie et al entitled "CMOS Differential Comparator with Hysteresis". Such previous solutions have required the addition of several devices creating a more complex design and requiring additional power.

SUMMARY OF THE INVENTION

The present invention achieves technical advantages as a simplified comparator circuit having hysteresis and lower power requirements for its implementation. The circuit includes 2 minimum-sized MOSFETs providing feedback from the circuit output to an input device's body to produce hystereis, requiring very little power. This invention is particularly suitable for applications not requiring a precisely set hysteresis magnitude.

DETAILED DESCRIPTION OF THE PREFERRED EMBODIMENT

Figure 1:
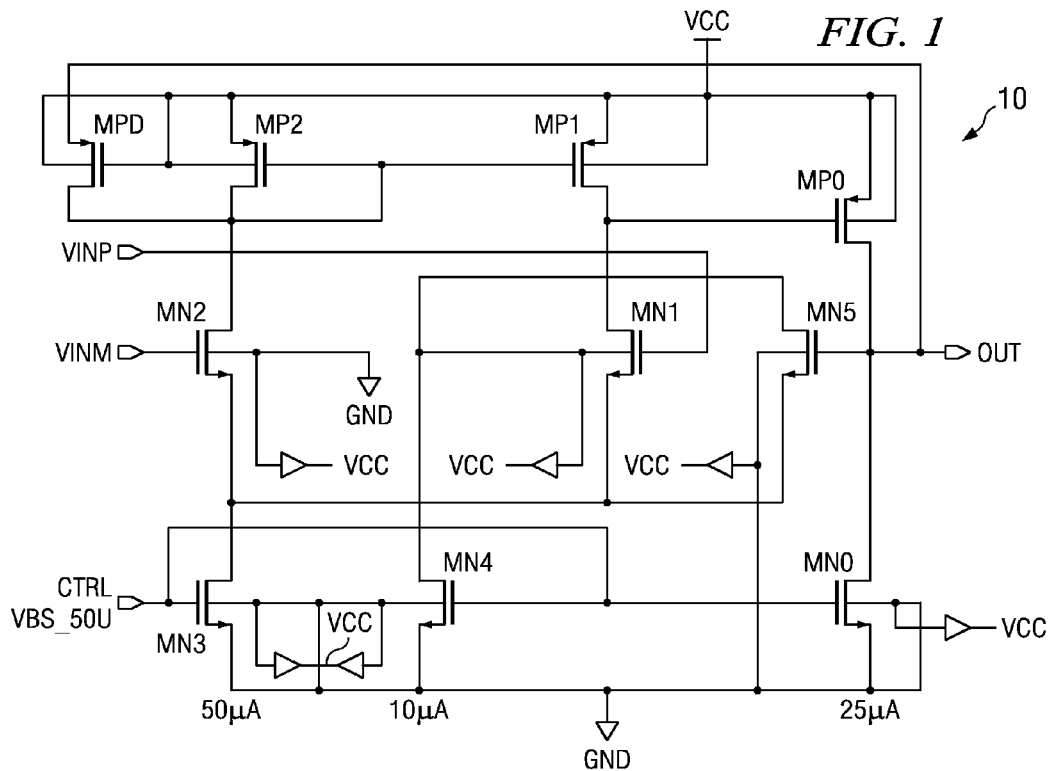
FIG. 1 is a schematic of an improved simplified comparator circuit having hysteresis according to the present invention.

FIG. 1 is the schematic of a new comparator 10 with hysteresis according to a preferred embodiment of the present invention. Transistors MN1 and MN2 form a input differential pair. Transistor MN3 provides a tail current, and transistors MP1 and MP2 provide a mirror of transistor MN2's drain current.

At balance, when voltages at inputs VINP and VINM are equal, currents in transistors MN1 and MP1 will be equal and the output at transistor MP0's drain will be at an intermediate voltage between VCC and GND. If input VINP is slightly higher than input VINM, then the balance will be disturbed and the output OUT will go high. Any noise at the inputs near this balance point will cause the output OUT to reflect that same noise gained up.

In order to remove this noise at the output OUT, it is desirable that once the output OUT goes high the first time, hysteresis modifies the input threshold such that the input differential voltage needs to drop considerably before reaching the new input threshold. This threshold change needs to be outside the range of expected input noise.

Figure 2:
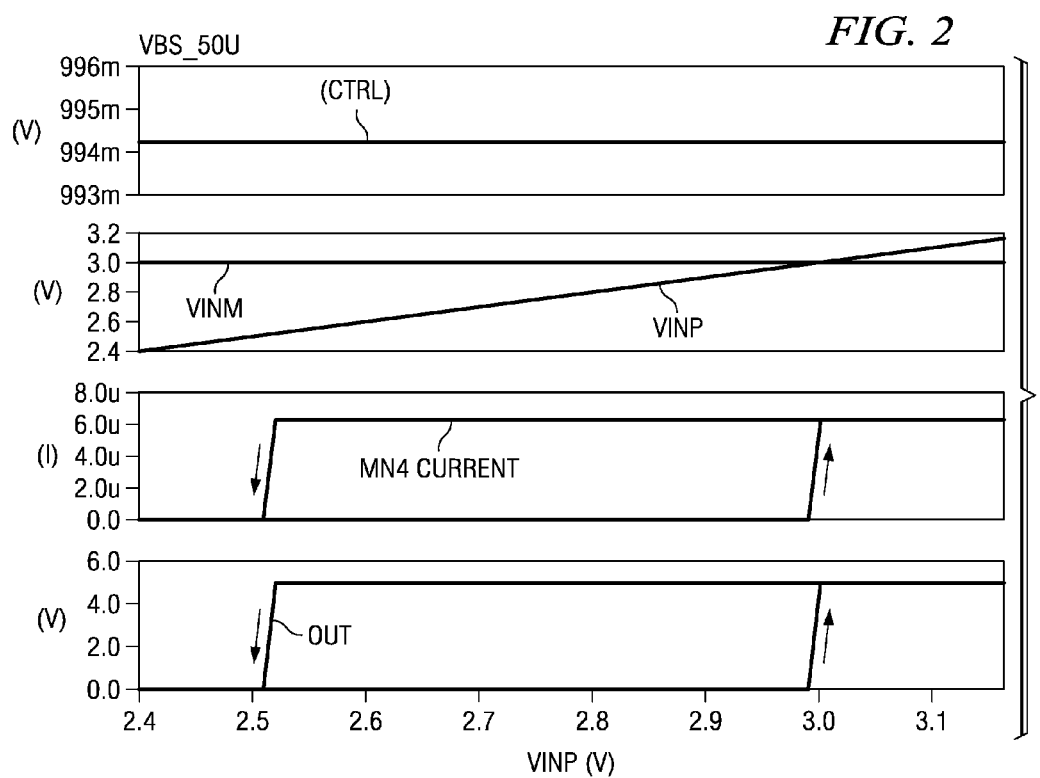
FIG. 2 is a timing diagram of the circuit of FIG. 1 showing the hysteresis and low static power.

According to one embodiment of the present invention, the back gates of transistors MN1 and MN2 are nominally tied to GND. The back gate of transistor MN2 is tied directly to GND, while the back gate of transistor MN1 is tied to GND through intermediate transistor MN4 providing a pulldown of 10 μA. Transistor MN4 is selectively enabled by a control signal CTRL, which CTRL signal is a bias line to define the DC currents in MN0, MN3 and MN4. Control signal CTRL is at GND potential when the comparator is biased off, and it is about 1V when the comparator is biased on. This pull-down current responsively goes to zero when transistor MN1's back gate is pulled down to GND. This condition exists when the input differential voltage is negative (VINP<VINM), the output OUT is low and transistor MN5 is off, as shown in FIG. 2.

Once the input differential voltage exceeds zero (VINP>VINM), the output OUT goes high, transistor MN5 consequently turns on and pulls transistor MN1's back gate voltage to that of its source. This, in-turn, advantageously causes the threshold of transistor MN1 to reduce compared to if its back gate was tied directly to GND. This threshold shift is the amount of hysteresis seen at the input VINP/VINM, and notably is a function of the body effect of the NMOS devices MN1 and MN2 in a particular semiconductor manufacturing process, and the common-mode voltage at the inputs VINP/VINM at the threshold. In this embodiment of the present invention, there is about a 0.5 volt Hysteresis.

Advantageously, the simple MOSFET differential circuit 10 having hysteresis is accomplished with the addition of only two small NMOS devices MN4 and MN5, and the only extra current is 10 μA, which current is most of the time off in applications that this comparator 10 may be used in, such as a delay circuit involving the charging of a capacitor. Thus, the static power dissipation if very low.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A comparator, comprising:
   (a) first and second MOSFETs connected as a differential pair with a first input coupled to the gate of said first MOSFET and a second input coupled to the gate of said second MOSFET;
   (b) an output coupled to the drain of said first MOSFET;
   (c) feedback from said output to the back gate of said first MOSFET; and
   (d) a connection of a reference potential to the back gate of said second MOSFET;
   (e) whereby said feedback provides hysteresis when said differential pair operates as a comparator.

2. The comparator of claim 1, wherein said feedback includes:
   (a) a pulldown MOSFET connected between said back gate of said first MOSFET and said reference potential; and
   (b) a pullup MOSFET connected between said back gate of said first MOSFET and the source of said first MOSFET with the gate of said pullup MOSFET connected to said output.

3. A CMOS comparator with hysteresis, comprising:
   (a) first and second NMOS transistors connected as a differential pair with a first input coupled to the gate of said first NMOS transistor and a second input coupled to the gate of said second NMOS transistor;

(b) a current source NMOS transistor connected between the sources of said first and second NMOS transistors and a ground;

(c) a first PMOS transistor connected between said first NMOS transistor and a supply voltage and a second PMOS transistor connected between said second NMOS transistor and said supply voltage;

(d) an output PMOS transistor and an output NMOS transistor connected in series between said supply voltage and said ground with the gate of said output PMOS transistor connected to the drain of said first NMOS transistor;

(e) a feedback NMOS transistor connected between the source of said first NMOS transistor and the back gate of said first NMOS transistor with the gate of said feedback NMOS transistor connected to said output;

(f) a pulldown NMOS transistor connected between said back gate of said first NMOS transistor and said ground; and (g) a connection of the back gate of said second NMOS transistor to said ground;

(h) whereby said feedback NMOS transistor plus said pulldown NMOS transistor provide hysteresis when said differential pair operates as a comparator.

* * * * *